United States Patent
Gao et al.

(10) Patent No.: US 7,800,882 B2
(45) Date of Patent: Sep. 21, 2010

(54) ELECTROSTATIC SHIELD AND METHOD OF FABRICATING THE SAME

(75) Inventors: De-Feng Gao, Shenzhen (CN); Qing-Bin Zeng, Shenzhen (CN)

(73) Assignees: Shenzhen Futaihong Precision Industry Co., Ltd., ShenZhen, Guangdong Province (CN); FIH (Hong Kong) Limited, Kowloon (HK)

( * ) Notice: Subject to any disclaimer, the term of this patent is extended or adjusted under 35 U.S.C. 154(b) by 757 days.

(21) Appl. No.: 11/692,059

(22) Filed: Mar. 27, 2007

(65) Prior Publication Data
US 2008/0130187 A1     Jun. 5, 2008

(30) Foreign Application Priority Data
Dec. 1, 2006    (CN) .................. 2006 1 0157310

(51) Int. Cl.
H02H 1/00   (2006.01)
H02H 1/04   (2006.01)
H02H 3/22   (2006.01)
H05F 3/00   (2006.01)
H05F 3/02   (2006.01)
H02H 9/00   (2006.01)

(52) U.S. Cl. .................. 361/212; 361/111; 361/56
(58) Field of Classification Search .................. 361/212
See application file for complete search history.

(56) References Cited

U.S. PATENT DOCUMENTS
6,493,198 B1 *  12/2002  Arledge et al. ................. 361/56

* cited by examiner

Primary Examiner—Stephen W Jackson
Assistant Examiner—Dharti H Patel
(74) Attorney, Agent, or Firm—Jeffrey T. Knapp

(57) ABSTRACT

An electrostatic shield (10) for use in a portable electronic device (A or B) includes a base (12), a conductive layer (14), and an electroplate layer (16). The conductive layer is formed on the base. The electroplate layer is formed on the conductive layer and defines an aperture (162) therethrough. A portion of the conductive layer is revealed/exposed through the electroplate layer via the aperture. A method for fabricating the electrostatic shield is also provided.

20 Claims, 7 Drawing Sheets

ELECTROSTATIC SHIELD AND METHOD OF FABRICATING THE SAME

BACKGROUND OF THE INVENTION

1. Field of the Invention

The present invention relates to an electrostatic shield and a method of fabricating the same, and, particularly, to an electrostatic shield including an electroplate layer and a method of fabricating the same.

2. Description of Related Art

Nowadays, portable electronic devices such as mobile phones, laptops, and personal digital assistants (PDAs) are widely used. These portable electronic devices require miniaturization for being used more easily. However, when a portable electronic device is miniaturized, a dimension of a circuit of the portable electronic device is also miniaturized. Therefore, the circuit may be more susceptible to damage by static electricity. For example, a person can easily acquire a static charge that has an electrostatic potential of about 12,000 volts when walking across a carpeted room. If that person then handles his portable electronic device, the static charge is likely to cause an instantaneous discharging with a high potential between the body of the person and the portable electronic device. Thus, the discharging may form an electrical current substantial enough to damage the miniaturized circuits of the portable electronic device.

Therefore, a design of electrostatic storage deflection (ESD) is widely used in portable electronic devices. In the portable electronic devices using the design of ESD, important electronic components of the portable electronic device are protected by electrostatic shields. The electrostatic shields are connected to a ground of the portable electronic device. When an instantaneous discharging happens to the portable electronic device, the charge is conducted to the ground to be released, and the electronic components are protected.

However, there are usually some electroplate layers on the electrostatic shields to protect and decorate the electrostatic shields. These electroplate layers are usually made of metal, and, therefore, an instantaneous discharging readily occurs between these electroplate layers and the body of a user having a static charge with a high electrostatic potential. Additionally, these electroplate layers are usually made of chrome for a high rigidity and a high stability. Thus, the electronic portable devices are more likely to be damaged by the instantaneous discharging, since a resistivity of chrome is too high to adequately conduct a charge in time.

Therefore, a new electrostatic shield and a new method for fabricating the same are desired in order to overcome the above-described shortcomings.

SUMMARY

In one aspect, an electrostatic shield includes a base, a conductive layer, and an electroplate layer. The conductive layer is formed on the base. The electroplate layer is formed on the conductive layer and has an aperture defined therein. A part of the conductive layer is exposed through the electroplate layer via the aperture.

In another aspect, a method for fabricating an electrostatic shield includes these steps: providing a base; forming a conductive layer on the base; forming an electroplate layer on the conductive layer; and defining an aperture in the electroplate layer to expose a part of the conductive layer through the electroplate layer via the aperture.

Other advantages and novel features will become more apparent from the following detailed description when taken in conjunction with the accompanying drawings.

BRIEF DESCRIPTION OF THE DRAWINGS

Many aspects of the present electrostatic shield can be better understood with reference to the following drawings. The components in the various drawings are not necessarily drawn to scale, the emphasis instead being placed upon clearly illustrating the principles of the present electrostatic shield and method of making such. Moreover, in the drawings, like reference numerals designate corresponding parts throughout the diagrams.

DETAILED DESCRIPTION OF THE INVENTION

Figure 1:
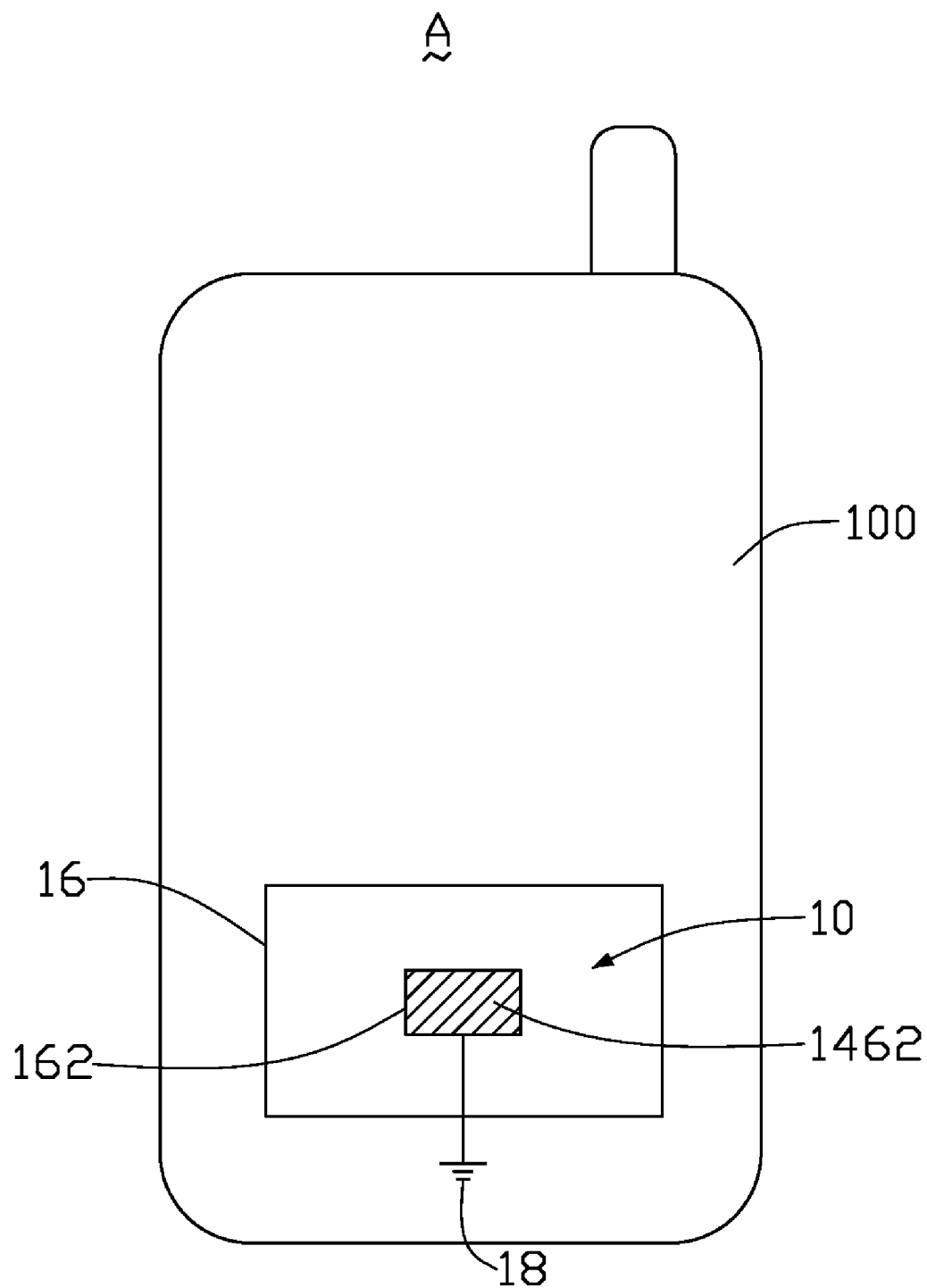
FIG. 1 is a schematic view of an electrostatic shield mounted within a portable electronic device, in accordance with a first preferred embodiment.
Figure 2:
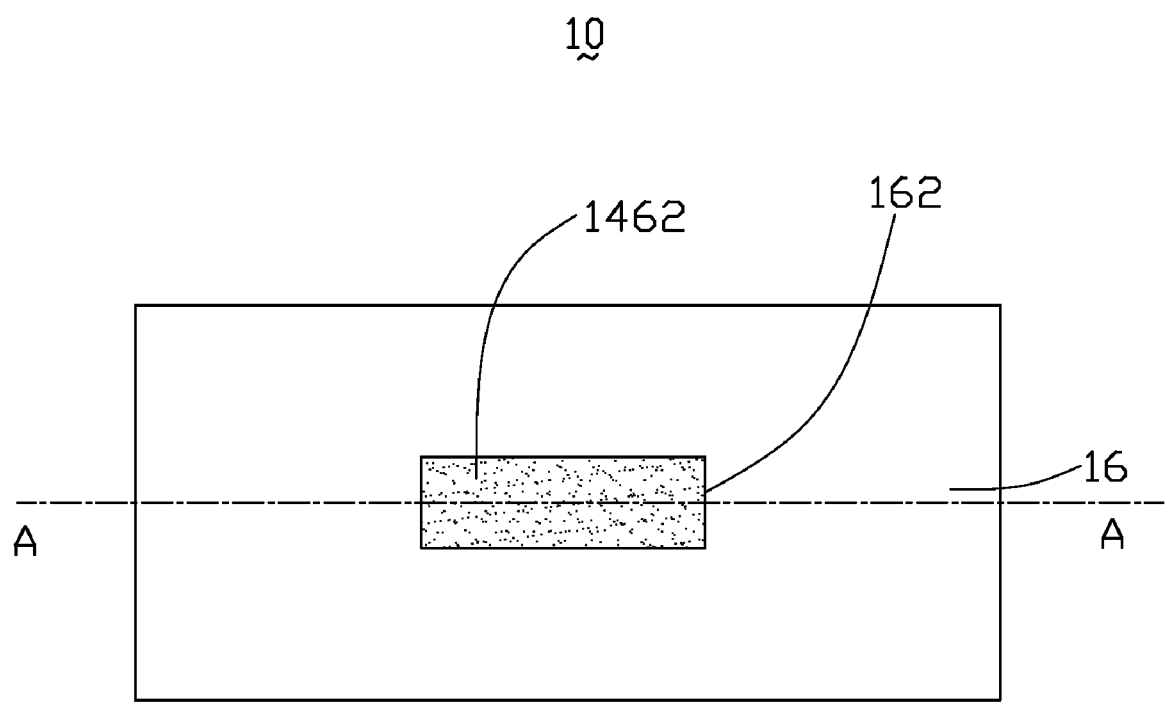
FIG. 2 is an enlarged, top, schematic view of the electrostatic shield shown in FIG. 1.
Figure 3:
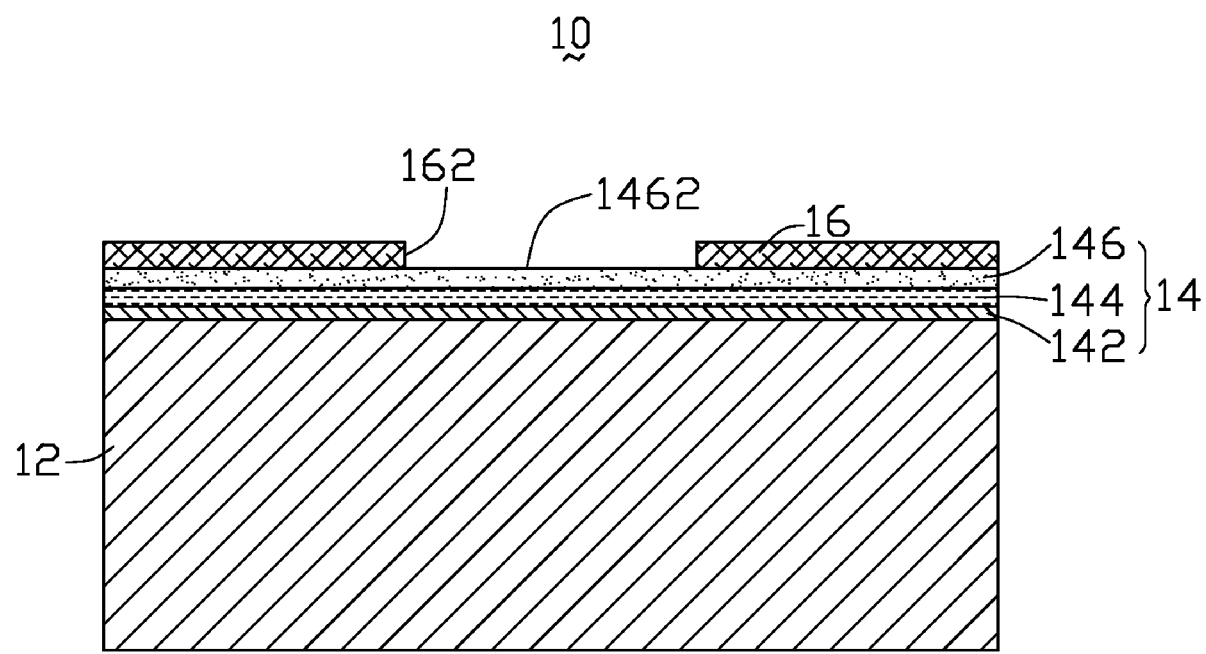
FIG. 3 is a cut-away view along the line A-A of the electrostatic shield shown in FIG. 2.

Referring now to the drawings in detail, FIG. 1 shows an electrostatic shield 10 in accordance with a first embodiment. The electrostatic shield 10 is mounted/secured within a housing 100 of a portable electronic device A, and the portable electronic device A can be a mobile phone, a PDA, a laptop, etc. Also referring to FIG. 2 and FIG. 3, the electrostatic shield 10 includes a base 12, a conductive layer 14, and an electroplate layer 16. The conductive layer 14 is formed on the base 12 and the electroplate layer 16 is formed on the conductive layer 14.

The base 12 is, advantageously, made of plastic. The conductive layer 14 includes, usefully, a main layer 142, a copper layer 144, and a nickel layer 146. The main layer 142 is, advantageously, made of palladium and nickel and formed on a surface of the base 12, the main layer 142 helping the further metal layers of the conductive layer 14 suitably bond with the base 12, which is made of a plastic in this embodiment. The copper layer 144 is formed on the main layer 142. The nickel layer 146 is formed on the copper layer 144 and defines an exposed portion 1462 thereon. It is to be understood that, within the scope of the present electrostatic shield, the main layer 142 could potentially be an alloy containing palladium and nickel; the copper layer 144 could be formed of a copper alloy; and/or the nickel layer 146 could be composed of a nickel alloy.

The electroplate layer 16 is made of chrome or, potentially, a chrome alloy and is formed on the nickel layer 146. The electroplate layer 16 defines an aperture 162 therein. The exposed portion 1462 of the nickel layer 144 is revealed/exhibited through the electroplate layer 16 via the aperture 162. A ground 18 of the portable electronic device A is electronically connected with the exposed portion 1462 via the aperture 162.

Understandably, when an instantaneous discharging occurs within the portable electronic device A, the redundant charges are conducted to the ground 18 by the nickel layer 146 and the copper layer 144. Because copper and nickel have high conductivities, the redundant charges can be released in a very short time, and, thus, the circuits of the portable electronic device A are protected.

Alternatively, the exposed portion 1462 of the nickel layer 146 and a part that is covered by the exposed portion 1462 of the copper layer 144 can be omitted, a part of the copper layer 144 or a part of the main layer 142 can be exposed out of the electroplate layer 16 from the aperture 162, and the ground 18 of the portable electronic device A can be electronically connected with the copper layer 144 and/or the main layer 142, via the aperture 162. In this way, when an instantaneous discharging would occur in the portable electronic device, the redundant charges could also be conducted to the ground 18 by the copper layer 144 or the main layer 142, and circuits of the portable electronic device A would still be protected. Some conducting ink (not shown) can be coated on the exposed portion 1462 or the exposed portion of the copper layer 144 or the main layer 142 for protecting the exposed portion 1462 of the nickel layer 146 or the exposed portion of the copper layer 144.

Figure 4:
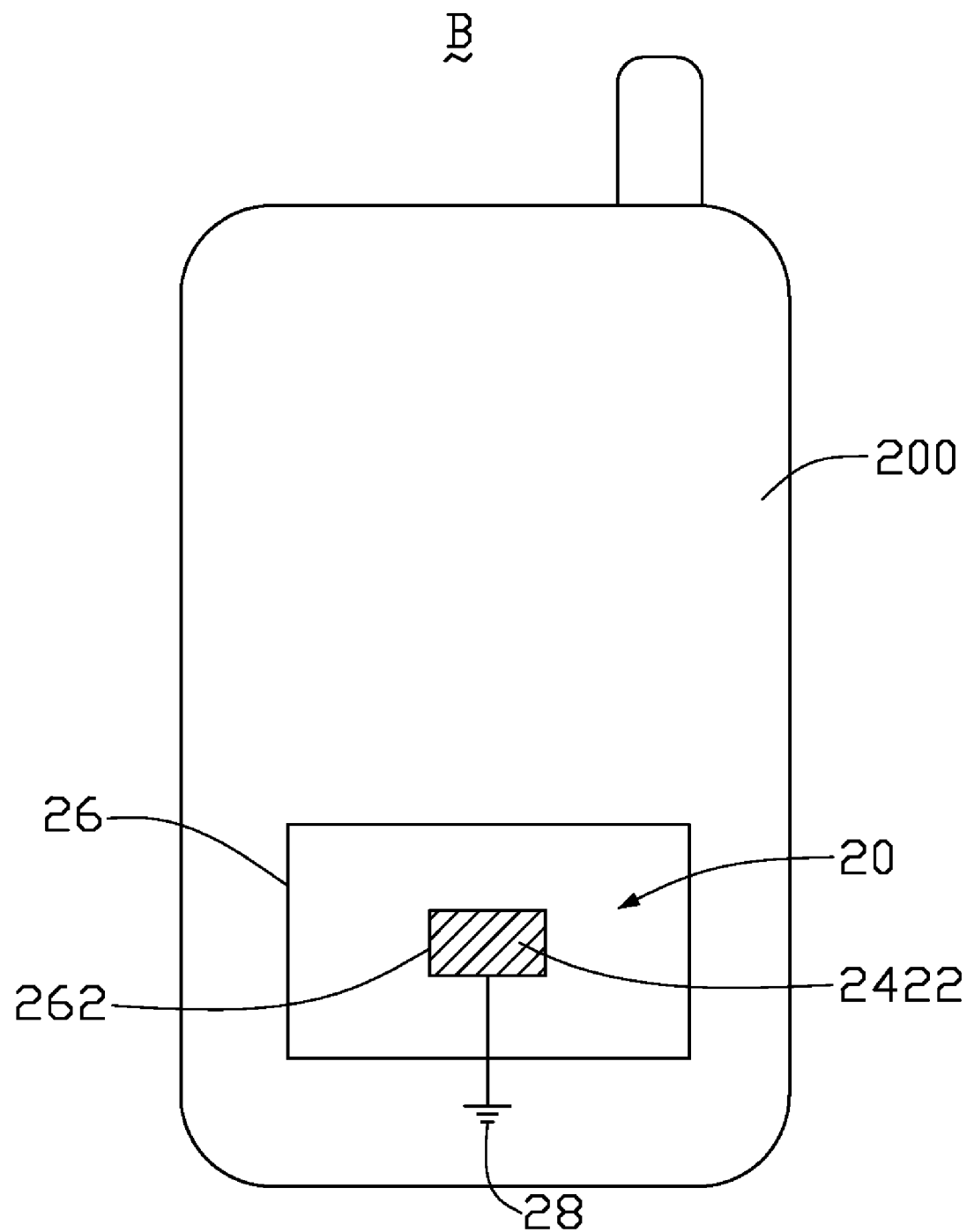
FIG. 4 is a schematic view of an electrostatic shield mounted within a portable electronic device, in accordance with a second preferred embodiment.
Figure 5:
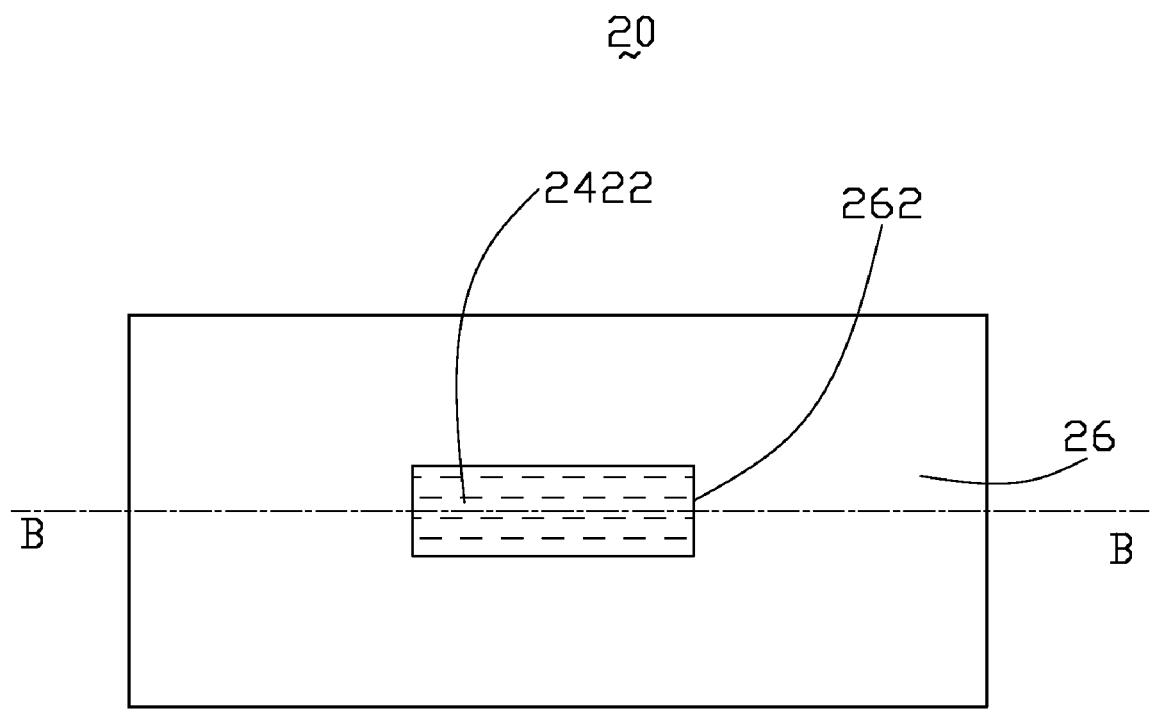
FIG. 5 is an enlarged, top, schematic view of the electrostatic shield shown in FIG. 4.
Figure 6:
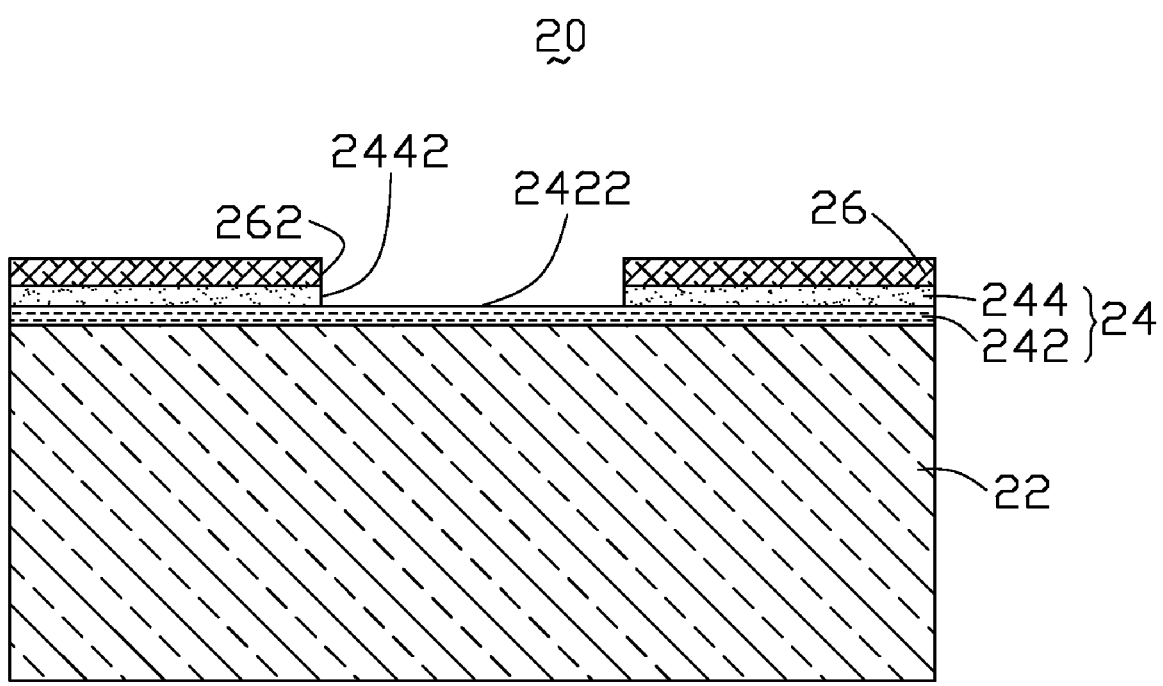
FIG. 6 is a cut-away view along the line B-B of the electrostatic shield shown in FIG. 5.

Referring to FIG. 4, an electrostatic shield 20, in accordance with a second embodiment, is provided. The electrostatic shield 20 is attached to a housing 200 of a portable electronic device B, such as a mobile phone, a PDA, a laptop, etc. Also referring to FIG. 5 and FIG. 6, the electrostatic shield 20 includes a base 22, a conductive layer 24, and an electroplate layer 26. The base 22 can be made of metal such as zinc, magnesium, cadmium, aluminum, etc., or of an alloy including one or more such metals. The conductive layer 24 includes a copper layer 242 and a nickel layer 244. The copper layer 242 is formed on the base 22, and the nickel layer 244 is formed on the copper layer 242. The nickel layer 244 defines an opening 2442, thus revealing an exposed portion 2422 of the copper layer 242. Similar to the first embodiment, it is to be understood that a copper alloy and/or a nickel alloy could, respectively, be used for layers 242, 244.

The electroplate layer 26 is made of chrome or a chrome alloy and is formed on the nickel layer 244. The electroplate layer 26 has an aperture 262 therein, corresponding to the opening 2442 of the nickel layer 244, and, thus, the exposed portion 2422 is exhibited through the electroplate layer 26, via the aperture 262 and the opening 2442. A ground 28 of the portable electronic device B is electronically connected with the exposed portion 2422 via the aperture 262. When an instantaneous discharging occurs in the portable electronic device B, the electrostatic shield 20 protects circuits of the portable electronic device B in the same way as the aforementioned electrostatic shield 10.

Figure 7:
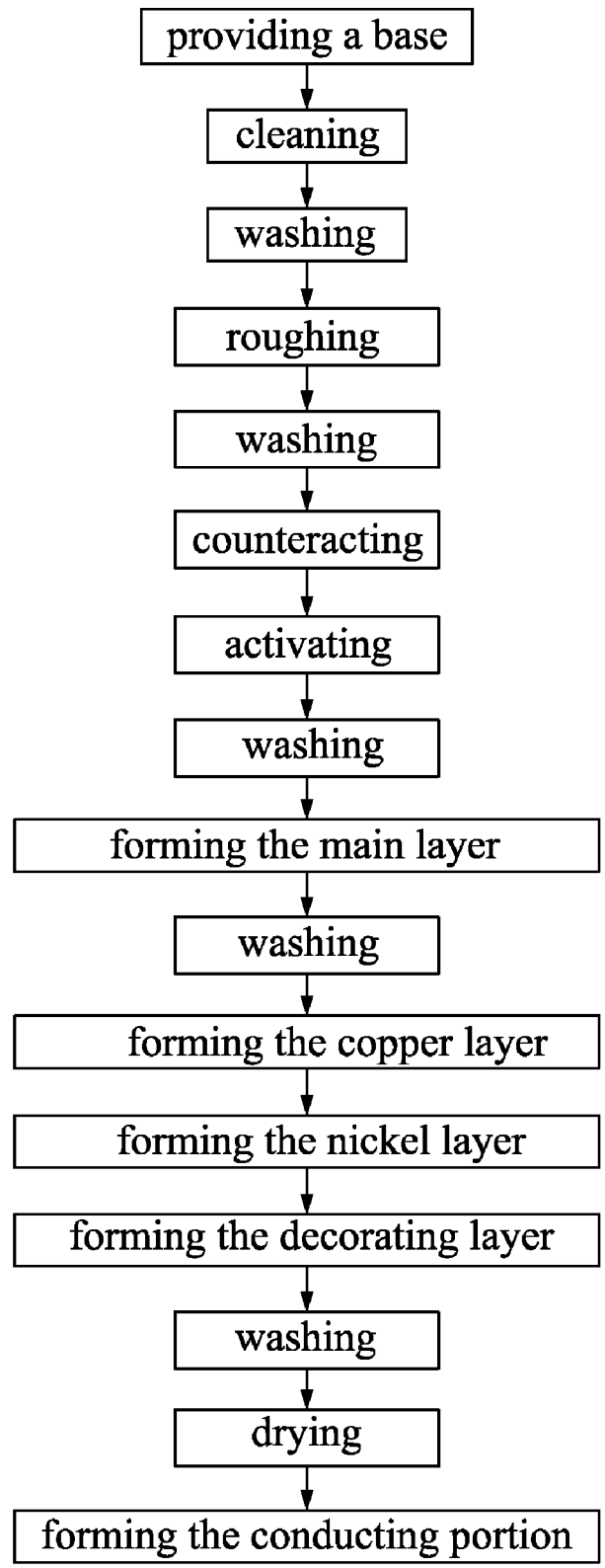
FIG. 7 is a diagram of a method for fabricating the electrostatic shield shown in FIG. 1.

Referring to FIG. 7, a method in accordance with a preferred embodiment of making the present electrostatic shield is provided. The method is, for example, used for fabricating aforementioned electrostatic shield 10 and comprises these steps:

providing a base 12;

providing cleanser, the cleanser usefully being a sodium hydroxide (NaOH) solution, sodium carbonate ($Na_2CO_3$) solution, sodium phosphate ($Na_3PO_4$) solution, etc., or potentially some combination thereof, a concentration of the cleanser being about 15-45 grams per liter;

dipping the base 12 in the cleanser for a time of about 6-12 minutes with a temperature in an approximate range of 30° C.-50° C. to clean the base 12;

washing the base 12 with softened water to clean/rinse any remaining cleanser on the base 12;

providing a etching solution, the etching solution advantageously being a sulfuric acid solution in a concentration of about 180-220 milliliters per liter or a $CrO_3$ solution in a concentration of about 400-450 milliliters per liter;

dipping the base 12 in the etching solution for a time of about 2-10 minutes at a temperature in an approximate range of 60° C.-80° C. to etch and thereby roughen a surface of the base 12;

washing the base 12 with softened water to clean remained etching solution on the base 12;

providing a basic solution, the basic solution suitably being an alkaline solution such as a NaOH solution in a concentration of about 10-20 grams per liter;

dipping the base 12 in the basic solution for a time of about 3-10 minutes at a temperature in a range of about 40° C.-55° C. to counteract the acidity of the remaining etching solution;

providing a palladium tin alloy solution in a concentration of about 10-20 grams per liter;

dipping the base 12 into the palladium tin alloy solution for a time of about 2-8 minutes at a temperature of about 40° C.-55° C. to activate the base 12 and form a palladium tin alloy layer on the base 12;

providing a NaOH solution in a concentrate of about 10-20 grams per liter;

dipping the base 12 in the basic solution for a time of about 2-6 minutes at a temperature of about 40° C.-55° C. to remove tin from the alloy coating formed on the base 12.

providing a nickel plating solution, the nickel plating solution including $NiSO_4$ in a concentration of about 20-30 grams per liter, $Na_3PO_3$ in a concentration of about 20-30 grams per liter, and $NH_4Cl$ in a concentration of about 10-15 grams per liter;

dipping the base 12 in the nickel plating solution for a time of about 3-8 minutes with a temperature in 35° C.-45° C. to deposit nickel on the base 12 and thereby creating the main layer 142 made of palladium and nickel on the base 12;

washing the base 12 with the main layer 142 formed directly thereon with softened water to clean the remaining NaOH solution and nickel plating solution from the base 12;

connecting the base 12 with the main layer 142 thereon to a plating cathode and connecting a copper pole to a plating anode;

dipping the base 12 and the copper pole in a $CuSO_4$ solution;

connecting the plating cathode and the plating anode to a power supply, to thereby form the copper layer 144 directly on the main layer 142;

connecting the base 12 to a plating cathode and connecting a nickel pole to a plating anode;

dipping the base 12 and the copper pole in $NiSO_4$ solution;

connecting the plating cathode and the plating anode to a power supply, to thereby form the nickel layer 146 directly on the copper layer 144 and thus yield the whole/entire conductive layer 14 on the base 12;

connecting the base 12 to a plating cathode and connecting a chrome pole to a plating anode;

dipping the base 12 and the copper pole in $Cr_2(SO_4)_3$ solution;

connecting the plating cathode and the plating anode to a power supply, to thereby form the decorating layer 16 directly on the nickel layer 146;

washing the base 12 with softened water to clean any remaining $CuSO_4$ solution, $NiSO_4$ solution, and/or $Cr_2(SO_4)_3$ solution from the base 12;

drying the base 12;

removing a portion of the electroplate layer 16 by means of laser carving/engraving or chemical etching to define the aperture 162 therein and thereby expose a portion of the nickel layer 146 through the electroplate layer 16 via the aperture 162, thus yielding the exposed portion 1462.

Understandably, because the base 12 is made of insulating plastic, it requires roughening a surface thereof, e.g., via etching and/or, potentially, grinding, and forming the main layer 142 on its surface. In this way the copper layer 144, the nickel layer 146, and the electroplate layer 16 can be formed on and suitably adhere to the base 12 by means of plating. When the aforementioned electrostatic shield 20 is fabricated, because the base 22 is made of conductive metal, the step of roughening (e.g., via etching/grinding) can be omitted, and the copper layer 242 and the nickel layer 244 can be directly formed on the base 22 by means of plating.

It is to be further understood that even though numerous characteristics and advantages of the present embodiments have been set forth in the foregoing description, together with details of structures and functions of various embodiments, the disclosure is illustrative only, and changes may be made in detail, especially in matters of shape, size, and arrangement of parts within the principles of the present invention to the full extent indicated by the broad general meaning of the terms in which the appended claims are expressed.

What is claimed is:

1. An electrostatic shield, comprising:
    a base;
    a conductive layer formed on the base; and
    an electroplate layer directly formed on the conductive layer and defining an aperture therein, a portion of the conductive layer being exposed through the electroplate layer via the aperture.
2. The electrostatic shield as claimed in claim 1, wherein the base is made of plastic.
3. The electrostatic shield as claimed in claim 1, wherein the conductive layer includes a main layer, a copper layer, and a nickel layer, the main layer is formed on a surface of the base, the copper layer is formed on the main layer, and the nickel layer is formed on the copper layer.
4. The electrostatic shield as claimed in claim 3, wherein the main layer is comprised of palladium and nickel.
5. The electrostatic shield as claimed in claim 3, wherein the nickel layer includes an exposed portion, the exposed portion being revealed through the electroplate layer via the aperture.
6. The electrostatic shield as claimed in claim 3, wherein a portion of the copper layer is exposed through the electroplate layer via the aperture.
7. The electrostatic shield as claimed in claim 3, wherein a part of the main layer is exposed through the electroplate layer via the aperture.
8. The electrostatic shield as claimed in claim 1, wherein the base is made of metal.
9. The electrostatic shield as claimed in claim 1, wherein the conductive layer includes a copper layer and a nickel layer, the copper layer is formed on the base, and the nickel layer is formed on the copper layer.
10. The electrostatic shield as claimed in claim 9, wherein the copper layer defines a exposed portion thereon, the exposed portion exposes out of the electroplate layer via the aperture.
11. The electrostatic shield as claimed in claim 1, wherein the electroplate layer is comprised of chrome.
12. A method for fabricating an electrostatic shield, comprising these steps:
    providing a base;
    forming a conductive layer on the base;
    forming an electroplate layer directly on the conductive layer; and
    defining an aperture in the electroplate layer to expose a portion of the conductive layer through the electroplate layer via the aperture.
13. The method as claimed in claim 12, wherein the conductive layer includes a main layer, a copper layer, and a nickel layer, the main layer is formed on a surface of the base, the copper layer is formed on the main layer, and the nickel layer is formed on the copper layer.
14. The method as claimed in claim 13, wherein the main layer is comprised of palladium and nickel.
15. The method as claimed in claim 13, wherein the copper layer is formed on the main layer by means of plating, and the nickel layer is formed on the copper layer by means of plating.
16. The method as claimed in claim 12, wherein the conductive layer includes a copper layer and a nickel layer, the copper layer is formed on the base, and the nickel layer is formed on the copper layer.
17. The method as claimed in claim 16, wherein the copper layer is formed on the base by means of plating, and the nickel layer is formed on the copper layer by means of plating.
18. The method as claimed in claim 17, wherein the electroplate layer is comprised of chrome, and the electroplate layer is formed on the conductive layer by means of plating.
19. A portable electronic device, comprising:
    a housing; and
    an electrostatic shield mounted within the housing, the electrostatic shield comprising:
        a base;
        a conductive layer formed on the base, the conductive layer includes a main layer, a copper layer, and a nickel layer, the main layer is formed on a surface of the base, the copper layer is formed on the main layer, and the nickel layer is formed on the copper layer; and
        an electroplate layer formed on the conductive layer and defining an aperture therein, a portion of the conductive layer being exposed through the electroplate layer via the aperture.
20. The portable electronic device as claimed in claim 19, wherein the main layer is comprised of palladium and nickel, the electroplate layer is comprised of chrome.

* * * * *